(12) United States Patent
Kaushik et al.

(10) Patent No.: US 9,231,530 B1
(45) Date of Patent: Jan. 5, 2016

(54) SYSTEM FOR CALIBRATING POWER AMPLIFIER

(71) Applicants: Arvind Kaushik, Ghaziabad (IN); Peter Z. Rashev, Calgary (CA); Amrit P. Singh, Ludhiana (IN); Akshat Mittal, Greater Noida (IN)

(72) Inventors: Arvind Kaushik, Ghaziabad (IN); Peter Z. Rashev, Calgary (CA); Amrit P. Singh, Ludhiana (IN); Akshat Mittal, Greater Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/591,928

(22) Filed: Jan. 8, 2015

(51) Int. Cl.
| | |
|---|---|
| *H04K 1/02* | (2006.01) |
| *H04L 25/03* | (2006.01) |
| *H04L 25/49* | (2006.01) |
| *H03F 1/32* | (2006.01) |
| *H04B 1/04* | (2006.01) |

(52) U.S. Cl.
CPC ............ *H03F 1/3241* (2013.01); *H04B 1/0475* (2013.01); *H04B 2001/0425* (2013.01)

(58) Field of Classification Search
CPC ..... H03F 1/3247; H03F 1/3258; H03F 3/189; H03F 1/3211; H03F 3/45968; H03F 1/3241; H04B 1/0475; H04B 2001/0425
USPC .......................................... 375/295, 296, 297
See application file for complete search history.

(56) References Cited

U.S. PATENT DOCUMENTS

| | | | |
|---|---|---|---|
| 5,900,778 A | 5/1999 | Stonick | |
| 7,577,211 B2 | 8/2009 | Braithwaite | |
| 7,746,957 B2 | 6/2010 | Ishikawa | |
| 7,783,263 B2 | 8/2010 | Sperlich | |
| 7,796,960 B1 | 9/2010 | Rashev | |
| 8,233,852 B2 | 7/2012 | Ahmed | |
| 8,326,239 B1 | 12/2012 | Peiris | |
| 8,385,391 B2 | 2/2013 | Balasubramanian | |
| 8,463,189 B2 | 6/2013 | Bashir | |
| 2003/0058959 A1 | 3/2003 | Rafie | |

(Continued)

FOREIGN PATENT DOCUMENTS

WO      2010136114      12/2010

OTHER PUBLICATIONS

Lei Guan and Anding Zhu, Low-Cost FPGA Implementation of Volterra Series-Based Digital Predistorter for RF Power Amplifiers, IEEE Transactions on Microwave Theory and Techniques, vol. 58, No. 4, Apr. 2010.

*Primary Examiner* — Freshteh N Aghdam
(74) *Attorney, Agent, or Firm* — Charles Bergere

(57) ABSTRACT

A system for calibrating a power amplifier (PA) includes a memory, a processor, a digital pre-distorter (DPD), and a data converter. The DPD includes a programming interface module, a pattern generator, a multiplier, and a pre-distorter module. The multiplier multiplies reference baseband stream data from the memory with pattern coefficient data generated by the pattern generator to generate shaped reference baseband stream data. The pre-distorter module generates pre-distorted shaped reference baseband stream data. The PA receives a low-power reference radio frequency (RF) signal corresponding to the pre-distorted shaped reference baseband stream data and generates a high-power reference RF signal. The processor receives and compares the pre-distorted shaped reference baseband stream data with amplified shaped reference baseband stream data corresponding to the high-power reference RF signal, and adjusts pre-distortion parameters in the pre-distorter module based on the comparison such that the PA generates a linear high-power RF signal.

19 Claims, 6 Drawing Sheets

(56) References Cited

U.S. PATENT DOCUMENTS

| | | |
|---|---|---|
| 2004/0121741 A1* | 6/2004 | Rashev et al. .............. 455/114.3 |
| 2004/0142667 A1 | 7/2004 | Lochhead |
| 2005/0141640 A1* | 6/2005 | Maruyama .................... 375/297 |
| 2007/0190952 A1* | 8/2007 | Waheed et al. ............ 455/114.3 |
| 2008/0298501 A1* | 12/2008 | Rabjohn et al. ............... 375/297 |
| 2009/0280758 A1* | 11/2009 | Pratt et al. .................. 455/127.2 |
| 2010/0302083 A1* | 12/2010 | Helfenstein et al. .......... 341/118 |
| 2012/0128098 A1 | 5/2012 | Haddad |
| 2013/0162349 A1 | 6/2013 | Gao |
| 2013/0243119 A1 | 9/2013 | Dalipi |
| 2014/0009224 A1 | 1/2014 | Van Zelm |
| 2014/0065989 A1* | 3/2014 | McLaurin .................. 455/114.3 |

* cited by examiner

Reference Baseband Stream Data

Triangular Wave

Ramp Wave

SYSTEM FOR CALIBRATING POWER AMPLIFIER

BACKGROUND OF THE INVENTION

The present invention relates generally to cellular communication systems, and, more particularly, to radio frequency (RF) transceivers in cellular communication systems.

A cellular communication system includes a mobile switching center (MSC), home location registers (HLRs), base station controllers (BSCs), base transceiver stations (BTSs), and user equipment (UE). A BTS facilitates communication between UEs and an MSC over a cellular network. The BTS includes an RF transceiver for transmitting and receiving RF signals to and from the UEs. Terms such as MSC, BSC, BTS, and UE are technology standard specific, and in this case are used in context of the Global System for Mobile communication (GSM) standard of wireless communication. For instance, the term BTS in the GSM standard corresponds to Node-B in the third generation (3G) and eNode-B in the fourth generation (4G) standards. The RF transceiver modulates a carrier wave by changing one or more characteristics of the carrier wave, viz. amplitude, frequency, and phase, based on an RF signal. The RF transceiver transmits a modulated carrier wave on a transmission medium by using an antenna.

FIG. 1 shows an RF transceiver system 100 that includes an RF transceiver 102 that is connected to an antenna 104 for transmitting the modulated carrier wave (hereinafter referred to as a "high-power RF signal"). The RF transceiver 102 includes a baseband processing unit 106, an RF integrated circuit (RFIC) 108, and a power amplifier (PA) 110. The baseband processing unit 106 includes a digital signal processor (DSP) 112, a system bus 114, a digital pre-distorter (DPD) 116, a direct memory access (DMA) system 118, a system memory 120, an event control module 122, and an antenna interface 124. The RFIC 108 includes an antenna interface 126, a data converter 128, and an RF mixer 130. The data converter 128 includes a digital-to-analog converter (DAC) 132 and an analog-to-digital converter (ADC) 134.

The DSP 112 performs logical and mathematical operations on digital data such as audio and video data and generates first baseband stream data. The DSP 112 is connected to the DPD 116, the DMA system 118, and the system memory 120 by way of the system bus 114. The DSP 112 is further connected to the event control module 122 and controls the event control module 122 by providing control trigger signals thereto. The event control module 122 generates trigger signals based on the control trigger signals to control the timing of events in the baseband processing unit 106 and the RFIC 108. The DPD 116 receives the first baseband stream data and generates pre-distorted first baseband stream data by multiplying the first baseband stream data with a set of coefficients from a look-up-table (LUT) stored therein. The set of coefficients are referred to as LUT coefficients. Further, the system memory 120 stores the pre-distorted first baseband stream data. The DMA system 118 and the DPD 116 are connected to the data converter 128 by way of the antenna interfaces 124 and 126. The antenna interface 124 receives the pre-distorted first baseband stream data from the DPD 116 and transfers the pre-distorted first baseband stream data to the antenna interface 126.

The DAC 132 receives the pre-distorted first baseband stream data from the antenna interface 126 and generates a first baseband signal. The RF mixer 130 that is connected to the DAC 132 receives the first baseband signal and generates a low-power first RF signal. The PA 110 that is connected to the RF mixer 130 receives the low-power first RF signal and generates a high-power first RF signal.

The RF mixer 130 receives the high-power first RF signal from the PA 110 and generates a second baseband signal. The ADC 134 receives the second baseband signal and generates second baseband stream data. The DMA system 118 receives the second baseband stream data by way of the antenna interfaces 126 and 124, and stores the second baseband stream data in the system memory 120. The DSP 112 compares the second baseband stream data with the pre-distorted first baseband stream data and selects alternate LUT coefficients from the LUT in the DPD 116. The DPD 116 multiplies the first baseband stream data with the alternate LUT coefficients to generate the pre-distorted first baseband stream data. The PA 110 receives the low-power first RF signal corresponding to the pre-distorted first baseband stream data and generates the high-power first RF signal at a higher power level.

It is desirable that the PA 110 achieves high efficiency and linearity. For instance, class A PAs are linear PAs but are expensive and thus unsuitable for cellular communication systems. Hence, inexpensive and non-linear PAs such as class AB, B, and C PAs are widely used. To maintain linearity of the PAs, digital pre-distortion technique is used. The DPD 116 performs a mathematical inversion of the high-power first RF signal of the PA 110. The DPD 116 is a non-linear module and the LUT coefficients have inverse characteristic of the high-power first RF signal. Thus, the pre-distorted first baseband stream data generated by the DPD 116 has an inverse characteristic of the high-power RF signal. When the non-linear PA 110 receives this pre-distorted first baseband stream data from the non-linear DPD 116, the PA 110 generates a linear high-power first RF signal. This process is referred to as digital pre-distortion.

For different RF signal conditions and cell radii of the BTS, it is essential to determine the ability of the DSP 112 to select alternate LUT coefficients for the corresponding RF signal conditions and the cell radii of the BTS. Thus, there is a need to calibrate the PA 110 for these RF signal conditions. The PA 110 is calibrated by adjusting the LUT coefficients of the DPD 116 during initialization of the RF transceiver 102 i.e., when the DSP 112 does not process actual digital data to be transmitted. The calibration of the PA 110 ensures that the PA 110 generates the high-power first RF signal at a desired power level when actual digital data is to be transmitted.

For calibrating the PA 110, the system memory 120 (or an external memory) stores reference baseband stream data. The DSP 112 shapes the reference baseband stream data to generate shaped reference baseband stream data by multiplying the reference baseband stream data with calibration patterns. The DSP 112 generates the calibration patterns that are mathematical polynomials having respective coefficients. The DPD 116 receives the shaped reference baseband stream data and generates a pre-distorted shaped reference baseband stream data. Finally, the PA 110 receives the pre-distorted shaped reference baseband stream data as a low-power reference RF signal and generates a high-power reference RF signal. Further, the DPD 116 repeats the process of digital pre-distortion and the DSP 112 adjusts the LUT coefficients of the DPD 116. Thus, at the end of the calibration process, the DSP 112 adjusts the LUT coefficients to ensure that the PA 110 generates a linear high-power RF signal.

A known technique in the art to calibrate the PA 110 loads the calibration patterns into the baseband processing unit 106 via external sources such as flash memory chips, local area network (LAN) and the like. As the calibration patterns are externally loaded into the baseband processing unit 106, this technique for calibration is not suitable in real-time applications. Further, as the DSP 112 accesses the system memory 120 multiple times to fetch the reference baseband stream data and the calibration patterns stored therein, data traffic on the system bus 114 increases. The increased data traffic results in higher power consumption of the RF transceiver 102.

An alternative solution is the use of the DSP 112 to generate the calibration patterns. However, the mathematical computation of generating the calibration patterns requires a high number of 'million instructions per second' (MIPS) (also referred to as "machine cycles") of the DSP 112 that otherwise could be used for more important tasks such as digital data processing. Moreover, this solution also results in an increase in the data traffic on the system bus 114 and consequently an increase in the power consumption of the RF transceiver 102.

Therefore, it would be advantageous to have an RF transceiver that calibrates the PA in real-time with reduced number of MIPS of the DSP.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. As used herein, the term multiplexer has been abbreviated as a mux.

DETAILED DESCRIPTION

Figure 1:
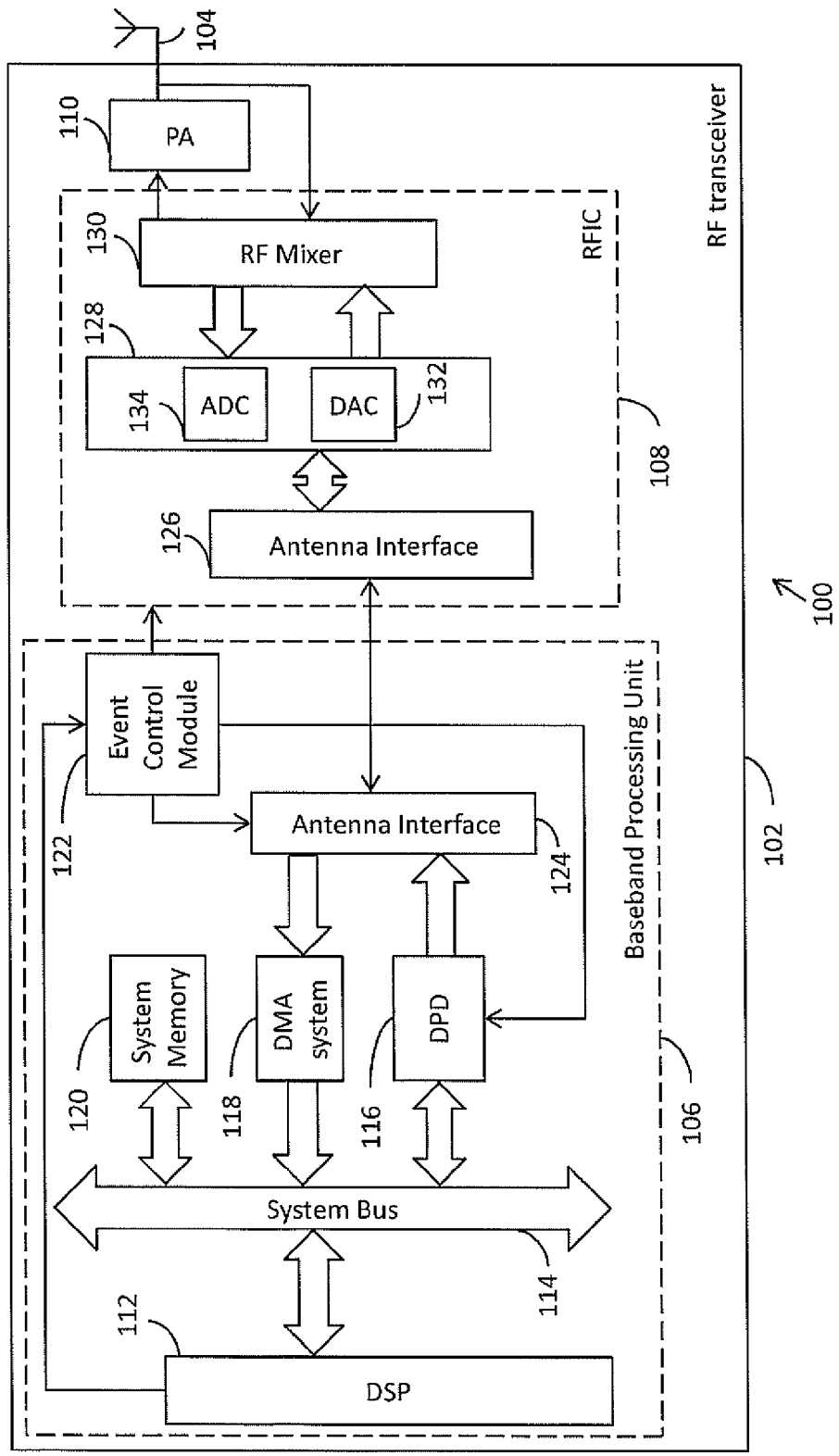
FIG. 1 is a schematic block diagram of a conventional radio frequency (RF) transceiver.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. The terms multiplexer and mux are used interchangeably in the description.

In an embodiment of the present invention, a system for calibrating a power amplifier is provided. The system includes a memory, a digital pre-distorter (DPD), a digital-to-analog converter (DAC), a radio frequency (RF) mixer, an analog-to-digital converter (ADC), and a processor. The DPD includes a programming interface module, a pattern generator, a multiplier, and a pre-distorter module. The memory stores reference baseband stream data. The DPD is connected to the memory. The programming interface module stores a seed value, first and second coefficient sequence values, first and second mode control values, a step size value, a step count value, first and second repetition count values, and an interrupt status value. The pattern generator is connected to the programming interface module for receiving the seed value, the first and second coefficient sequence values, the first and second mode control values, the step size value, the step count value, the first and second repetition count values, and generating pattern coefficient data. The multiplier is connected to the pattern generator and the memory for receiving the pattern coefficient data and the reference baseband stream data, respectively, and generating shaped reference baseband stream data. The pre-distorter module is connected to the multiplier for receiving the shaped reference baseband stream data and generating pre-distorted shaped reference baseband stream data. The memory stores the pre-distorted shaped reference baseband stream data. The DAC is connected to the pre-distorter module for receiving the pre-distorted shaped reference baseband stream data and generating a pre-distorted shaped reference baseband signal. The RF mixer is connected to the DAC for receiving the pre-distorted shaped reference baseband signal and generating an RF shaped reference baseband signal. The power amplifier is connected to the RF mixer for receiving the RF shaped reference baseband signal and generating an amplified RF shaped reference baseband signal. The RF mixer receives the amplified RF shaped reference baseband signal and generates an amplified shaped reference baseband signal. The ADC is connected to the RF mixer for receiving the amplified shaped reference baseband signal and generating amplified shaped reference baseband stream data. The processor is connected to the ADC and the memory for receiving the amplified and pre-distorted shaped reference baseband stream data, respectively, generating comparison data based on the amplified shaped and pre-distorted shaped reference baseband stream data, and adjusting a plurality of pre-distortion parameters based on the comparison data, thereby calibrating the power amplifier.

In another embodiment of the present invention, an RF transceiver is provided. The RF transceiver includes a baseband processing unit, an RF integrated circuit (RFIC), and a power amplifier. The baseband processing unit includes a memory, a processor, an event control module, and a digital pre-distorter (DPD). The RFIC includes a data converter and an RF mixer. The memory stores reference baseband stream data. The processor generates a control start trigger signal. The event control module is connected to the processor, for receiving the control start trigger signal and generating a start trigger signal. The DPD is connected to the memory and the event control module for receiving the reference baseband stream data and the start trigger signal, respectively, and generating pre-distorted shaped reference baseband stream data, respectively. The memory stores the pre-distorted shaped reference baseband stream data. The RFIC is connected to the baseband processing unit. The data converter is connected to the DPD for receiving the pre-distorted shaped reference baseband stream data and generating a pre-distorted shaped reference baseband signal. The RF mixer is connected to the data converter for receiving the pre-distorted shaped reference baseband signal and generating an RF shaped reference baseband signal. The power amplifier is connected to the RF mixer for receiving the RF shaped reference baseband signal and generating an amplified RF shaped reference baseband signal. The RF mixer receives the amplified RF shaped reference baseband signal and generates an amplified shaped reference signal. The data converter receives the amplified shaped reference signal and generates amplified shaped reference baseband stream data. The processor receives the pre-distorted and amplified shaped reference baseband stream data, generates comparison data, and adjusts a plurality of pre-distortion parameters based on the comparison data, thereby calibrating the power amplifier.

In yet another embodiment of the present invention, a method for calibrating a power amplifier in an RF transceiver is provided. The RF transceiver includes a baseband processing unit, an RF integrated circuit (RFIC), and a power amplifier. The baseband processing unit includes a memory, a processor, an event control module, and a digital pre-distorter (DPD). The RFIC includes a data converter and an RF mixer. The method includes storing reference baseband stream data in the memory. The programming interface module stores a seed value, first and second coefficient sequence values, first and second mode control values, a step size value, a step count value, first and second repetition count values, and an interrupt status value. The pattern generator generates pattern coefficient data based on the seed value, the first and second coefficient sequence values, the first and second mode control values, the step size value, the step count value, and the first and second repetition count values. The multiplier generates shaped reference baseband stream data. The pre-distorted module generates pre-distorted shaped reference baseband stream data based on the shaped reference baseband stream data. The DAC generates a pre-distorted shaped reference baseband signal based on the pre-distorted shaped reference baseband stream data. The RF mixer generates an RF shaped reference baseband signal based on the pre-distorted shaped reference baseband signal. The power amplifier generates an amplified RF shaped reference baseband signal based on the RF shaped reference baseband signal. The RF mixer generates an amplified shaped reference baseband signal based on the amplified RF shaped reference baseband signal. The ADC generates amplified shaped reference baseband stream data based on the amplified shaped reference baseband signal. The processor generates comparison data based on the pre-distorted and amplified shaped reference baseband stream data. The processor adjusts the pre-distortion parameters based on the comparison data, thereby calibrating the power amplifier.

Various embodiments of the present invention provide a system for calibrating a power amplifier. The system includes a memory, a digital pre-distorter (DPD), a digital-to-analog converter (DAC), a radio frequency (RF) mixer, a power amplifier, an analog-to-digital converter (ADC), and a processor. The DPD includes a programming interface module, a pattern generator, a multiplier, and a pre-distorter module. The memory stores reference baseband stream data. The pattern generator receives a seed value, first and second coefficient sequence values, first and second mode control values, a step size value, a step count value, and first and second repetition count values and generates pattern coefficient data. The multiplier generates shaped reference baseband stream data based on the pattern coefficient data and the reference baseband stream data. The pre-distorter module generates pre-distorted shaped reference baseband stream data based on the shaped reference baseband stream data. The power amplifier receives an RF shaped reference baseband signal corresponding to the pre-distorted shaped reference baseband stream data and generates an amplified RF shaped reference baseband signal. The ADC generates amplified shaped reference baseband stream data based on an amplified shaped reference baseband signal corresponding to the amplified RF shaped reference baseband signal. The processor generates comparison data based on the amplified and pre-distorted shaped reference baseband stream data, and adjusts pre-distortion parameters based on the comparison data. As the pattern generator generates the pattern coefficient data in real-time, the calibration of the power amplifier is performed in real-time during time periods the system does not transmit digital data. Further, as the pattern coefficient data is not stored in the memory, the DSP does not have to fetch the pattern coefficient data for calibration, resulting in reduced data traffic on a system bus. The reduced data traffic further reduces power consumption of the system. Moreover, as the DSP does not generate the pattern coefficient data, the machine cycles thereof are reduced.

Figure 2:
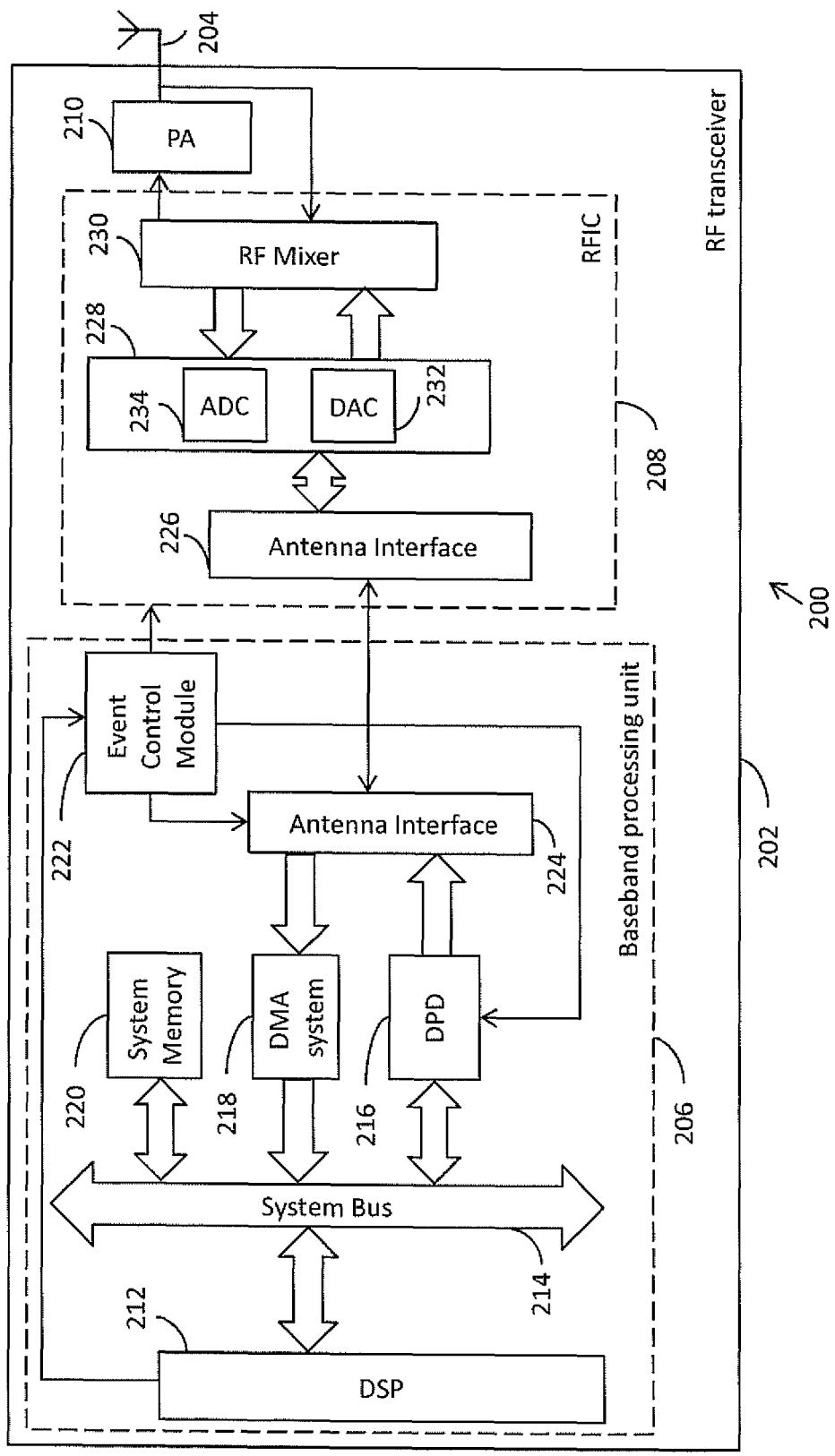
FIG. 2 is a schematic block diagram of an RF transceiver in accordance with an embodiment of the present invention.

Referring now to FIG. 2, a schematic block diagram of a radio-frequency (RF) transceiver system 200, in accordance with an embodiment of the present invention is shown. The RF transceiver system 200 is used in base transceiver stations (BTS) of cellular communication systems. The RF transceiver system 200 includes a baseband processing unit 206, an RF integrated circuit (RFIC) 208, and a power amplifier (PA) 210. The baseband processing unit 206 includes a digital signal processor (DSP) 212, a system bus 214, a digital pre-distorter (DPD) 216, a direct memory access (DMA) system 218, a system memory 220, an event control module 222, and an antenna interface 224. The RFIC 208 includes an antenna interface 226, a data converter 228, and an RF mixer 230. The data converter 228 includes a digital-to-analog converter (DAC) 232 and an analog-to-digital converter (ADC) 234. For calibrating the PA 210, the system memory 220 stores reference baseband stream data.

The DSP 212 performs logical and mathematical operations on digital data such as audio and video data and generates first baseband stream data. The DSP 212 is connected to the DPD 216, the DMA system 218, and the system memory 220 by way of the system bus 214. The DSP 212 is further connected to the event control module 222 and controls the event control module 222 by providing control trigger signals thereto. The event control module 222 generates trigger signals based on the control trigger signals, to control the timing of events in the baseband processing unit 206 and the RFIC 208. The DPD 216 receives the first baseband stream data and generates pre-distorted first baseband stream data by multiplying the first baseband stream data with a set of coefficients from a look-up-table (LUT) (not shown) stored therein. The set of coefficients are referred to as LUT coefficients. Further, the system memory 220 stores the pre-distorted first baseband stream data. The DMA system 218 and the DPD 216 are connected to the data converter 228 by way of the antenna interfaces 224 and 226. The antenna interface 224 receives the pre-distorted first baseband stream data from the DPD 216 and transfers the pre-distorted first baseband stream data to the antenna interface 226.

The DAC 232 receives the pre-distorted first baseband stream data from the antenna interface 226 and generates a first baseband signal. The RF mixer 230 that is connected to the DAC 232 receives the first baseband signal and generates a low-power first RF signal. The PA 210 that is connected to the RF mixer 230 receives the low-power first RF signal and generates a high-power first RF signal.

The RF mixer 230 receives the high-power first RF signal from the PA 210 and generates a second baseband signal. The ADC 234 receives the second baseband signal and generates second baseband stream data. The DMA system 218 receives the second baseband stream data by way of the antenna interfaces 226 and 224, and stores the second baseband stream data in the system memory 220. The DSP 212 accesses the system memory 220 and compares the second baseband stream data with the pre-distorted first baseband stream data. The DSP 212 selects alternate LUT coefficients from the LUT in the DPD 216 based on the comparison of the second baseband stream data with the pre-distorted first baseband stream data. The DPD 216 multiplies the first baseband stream data with the alternate LUT coefficients to generate the pre-distorted first baseband stream data. The PA 210 receives the low-power first RF signal corresponding to the pre-distorted first baseband stream data and generates the high-power first RF signal at a higher power level.

Figure 3:
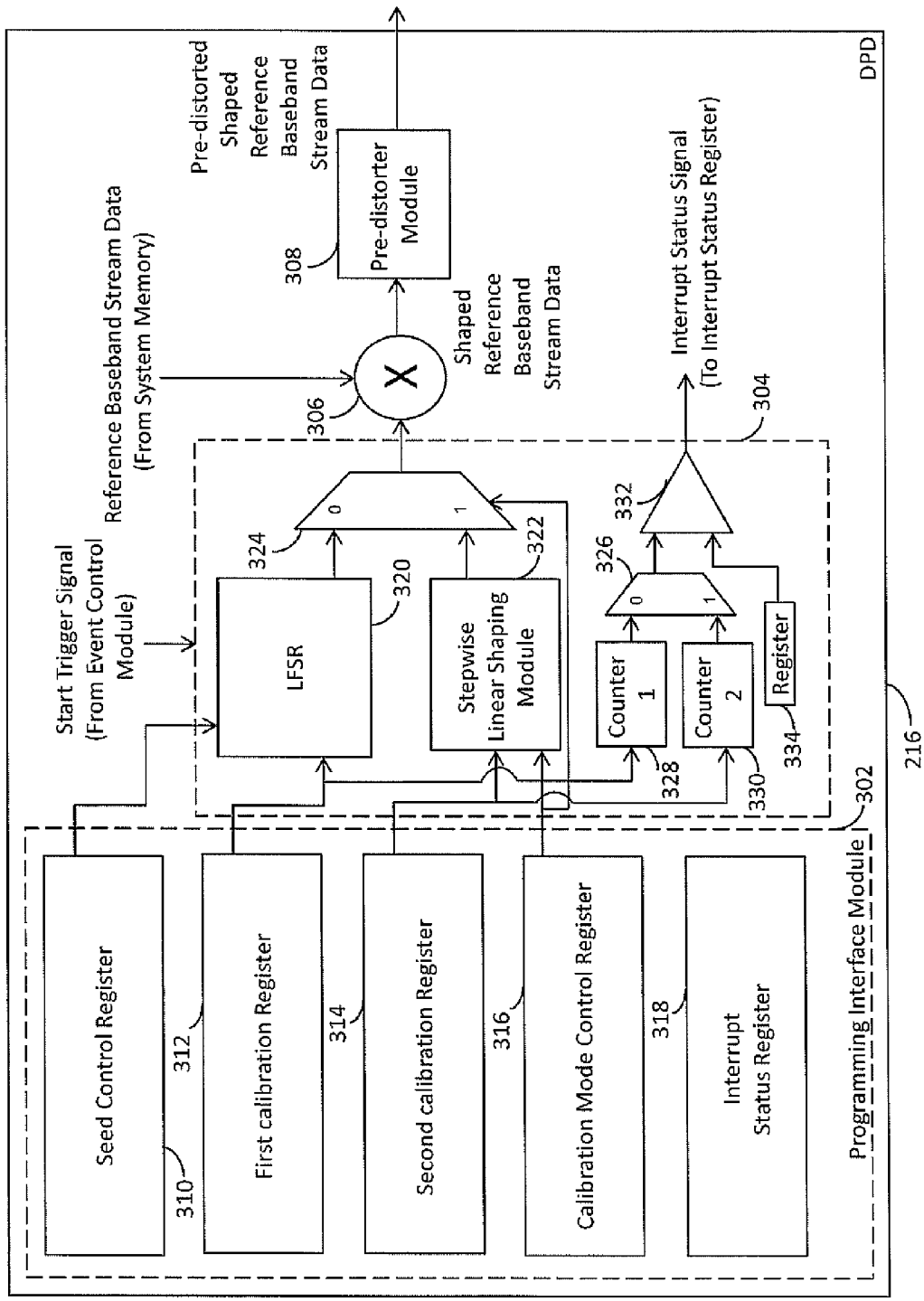
FIG. 3 is a schematic block diagram of a digital pre-distorter (DPD) of the RF transceiver of FIG. 2 in accordance with an embodiment of the present invention.

Referring now to FIG. 3, a schematic block diagram of the DPD 216 of the RF transceiver 202 of FIG. 2, in accordance with an embodiment of the present invention is shown. The DPD 216 includes a programming interface module 302, a pattern generator 304, a multiplier 306, and a pre-distorter module 308. The programming interface module 302 includes a seed control register 310, a first calibration register 312, a second calibration register 314, a calibration mode control register 316, and an interrupt status register 318. The pattern generator 304 includes a linear feedback shift register (LFSR) 320, a stepwise linear shaping module 322, first and second multiplexers or muxes 324 and 326, first and second N-bit down counters 328 and 330, a comparator 332, and a register 334. It will be apparent to a skilled artisan that the first and second N-bit down counters 328 and 330 may be replaced by N-bit up counters as well. Further, it is well known in the art that an LFSR includes a cascade of flip-flops and exclusive-OR (XOR) gates. The stepwise linear shaping module 322 includes an accumulator that includes an N-bit adder and a register (not shown). The pre-distorter module 308 includes the LUT that stores the LUT coefficients (also referred to as "pre-distortion parameters").

Figure 4A:
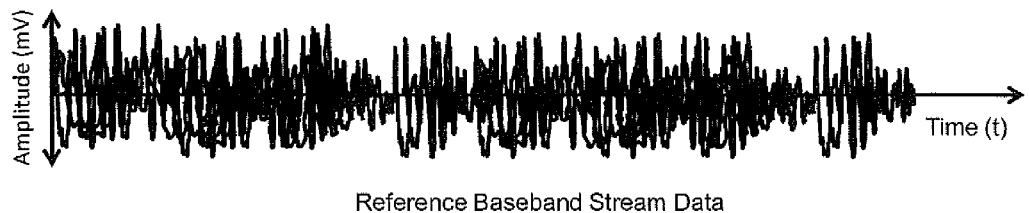
FIGS. 4A, 4B, and 4C illustrate various waveforms in accordance with an embodiment of the present invention.
Figure 4B:
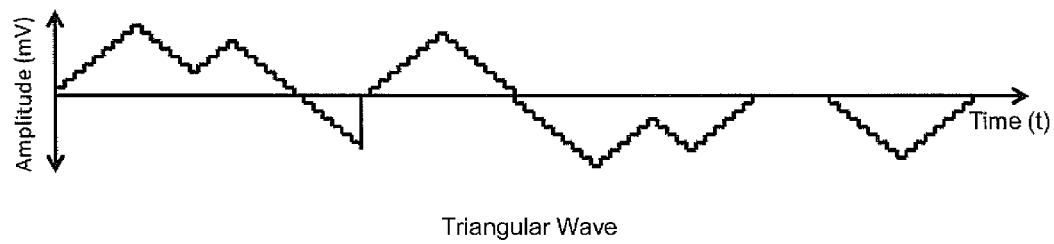
Figure 4C:
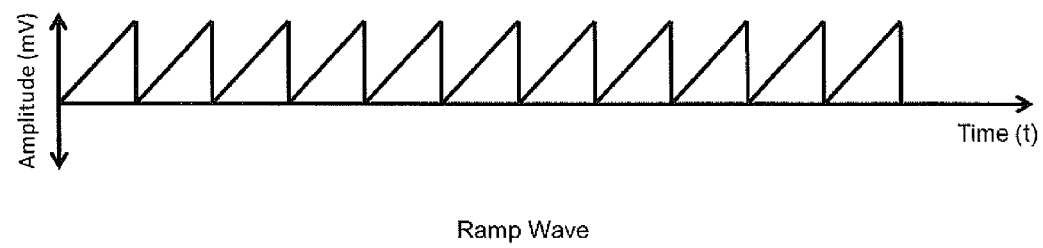

Referring now to FIGS. 4A, 4B, and 4C, plots illustrating the reference baseband stream data, a triangular wave, and a ramp up wave in accordance with an embodiment of the present invention are shown. FIGS. 4A, 4B, and 4C are explained in conjunction with FIG. 3.

The seed control register 310 stores a seed value that corresponds to an initial characteristic polynomial of the LFSR 320. The first calibration register 312 stores first coefficient sequence value and first repetition count value. The first coefficient sequence value corresponds to a maximum length of an LFSR sequence data and the first repetition count value represents the number of times the LFSR 320 generates the LFSR sequence data to perform calibration of the PA 210. The maximum length of the LFSR sequence data is determined by using the equation $(2^N-1)$, where N is a number of flip-flops in the LFSR 320. The first calibration register 312 is a programmable register and the first coefficient sequence value and the first repetition count value may be programmed by a user.

The second calibration register 314 stores a step size value, a step count value, second coefficient sequence value, and second repetition count value. The second coefficient sequence value corresponds to a maximum length of a stepwise sequence data and the second repetition count value represents the number of times the stepwise linear shaping module 322 generates the stepwise sequence data to perform calibration of the PA 210. The calibration mode control register 316 stores first and second mode control values. The interrupt status register 318 stores an interrupt status value.

The LFSR 320 that is connected to the seed control register 310 and the first calibration register 312 receives the seed value, the first coefficient sequence value, and the first repetition count value, and generates the LFSR sequence data. The stepwise linear shaping module 322 that is connected to the second calibration register 314 receives the step size value, the step count value, the second coefficient sequence value, and the second repetition count value and generates the step sequence data. The stepwise linear shaping module 322 is further connected to the calibration mode control register 316 for receiving the second mode control value. The stepwise linear shaping module 322 generates the stepwise sequence data corresponding to a ramp wave or a triangular wave based on the second mode control value, as shown in FIGS. 4B and 4C. The first mux 324 has a first input terminal connected to the LFSR 320 to receive the LFSR sequence data, a second input terminal connected to the stepwise linear shaping module 322 to receive the stepwise sequence data, a select input terminal connected to the calibration mode control register 316 to receive the first mode control value, and an output terminal to output at least one of the LFSR sequence data and the stepwise sequence data based on the first mode control value.

The first and second N-bit down counters 328 and 330 are connected to the first and second calibration registers 312 and 314 for receiving the first and second repetition count values, and generating first and second count values, respectively. The second mux 326 has a first input terminal connected to the first N-bit down counter 328 to receive the first count value, a second input terminal connected to the second N-bit down counter 330 to receive the second count value, a select input terminal connected to the calibration mode control register 316 to receive the first mode control value, and an output terminal to output at least one of the first and second count values based on the first mode control value. The comparator 332 has a first input terminal connected to the output terminal of the second mux 326 to receive at least one of the first and second count values, a second input terminal connected to the register 334 to receive a binary zero value, and an output terminal to output an interrupt status signal. The interrupt status register 318 receives the interrupt status signal and a logic state of the interrupt status value toggles based on the interrupt status signal.

The multiplier 306 has a first input terminal connected to the output terminal of the first mux 324 to receive at least one of the LFSR sequence data and the stepwise sequence data, a second input terminal connected to the DMA system 218 to fetch the reference baseband stream data from the system memory 220 as shown in FIG. 4A, and an output terminal to generate the shaped reference baseband stream data by multiplying the reference baseband stream data with at least one of the LFSR sequence data and the stepwise sequence data. The pre-distorter module 308 receives the shaped reference baseband stream data and generates the pre-distorted shaped reference baseband stream data. The DMA system 218 accesses the system memory 220 to fetch the reference baseband stream data.

The DSP 212 calibrates the PA 210 during an initialization phase of the RF transceiver 202. The DSP 212 may calibrate the PA 210 when the DSP 212 does not transmit user-data. Further, the RF mixer 230 receives a second RF signal and generates an analog baseband signal. The ADC 234 receives the analog baseband signal and generates third baseband stream data. When the DSP 212 detects no user-data in the third baseband stream data, the DSP 212 calibrates the PA 210.

The DSP 212 generates a control start trigger signal. The event control module 222 receives the control start trigger signal and generates the start trigger signal. The LFSR 320, the stepwise linear shaping module 322, and the first and second N-bit counters 328 and 330 receive the start trigger signal. When the control start trigger signal toggles between logic high and low states, the start trigger signal also toggles between logic high and low states. When the start trigger signal toggles between logic high and low states, the LFSR 320 and the stepwise linear shaping module 322 generate the LFSR sequence data and the step sequence data (collectively referred to as "pattern coefficient data"), respectively. Further, the first and second N-bit counters 328 and 330 are loaded with the first and second repetition count values and the first and second N-bit counters 328 and 330 start a count of the first and second repetition count values, respectively.

In an example, the first mode control value is at logic low state. When the start trigger signal toggles between logic high and low states, the first mux 324 outputs the LFSR sequence data and the first N-bit counter 328 starts a count of the first repetition count value. Thus, the second mux 326 outputs the first count value. The multiplier 306 multiplies the LFSR sequence data with the reference baseband stream data and generates the shaped reference baseband stream data. The pre-distorter module 308 consequently generates the pre-distorted shaped reference baseband stream data by applying the LUT coefficients to the shaped reference baseband stream data. The comparator 332 receives the first count value from the second mux 326 and the binary zero value from the register 334, compares the first count value with the binary zero value and generates the interrupt status signal at logic low state. The interrupt status register 318 receives the logic low interrupt status signal and stores the interrupt status value as binary zero.

The DAC 232 generates a pre-distorted shaped reference baseband signal corresponding to the pre-distorted shaped reference baseband stream data. The RF mixer 230 generates a low-power reference RF signal (also referred to as "RF shaped reference baseband signal") corresponding to the pre-distorted shaped reference baseband signal. The PA 210 generates a high-power reference RF signal (also referred to as "amplified RF shaped reference baseband signal") based on the low-power reference RF signal at a first power level.

The RF mixer 230 receives the high-power reference RF signal and generates an amplified shaped reference signal. The ADC 234 receives the amplified shaped reference signal and generates amplified shaped reference baseband stream data. The DSP 212 compares the pre-distorted shaped reference baseband stream data and the amplified shaped reference baseband stream data and adjusts the LUT coefficients of the pre-distorter module 308 such that the PA 210 generates linear high-power RF signals in real-time. This calibration process continues till the first N-bit counter 328 count value corresponds to binary zero. As the LFSR 320 generates random LFSR sequence data, the PA 210 may be forced to operate linearly as well as non-linearly. Thus, to determine the adaptability of the DPD 216 during real-time for digital pre-distortion of the digital data, the DSP 212 selects the LFSR 320 to shape the reference baseband stream data.

In another example, the first mode control value is at logic high state. When the start trigger signal toggles between logic high and low states, the first mux 324 outputs the stepwise sequence data and the second N-bit counter 330 starts a count of the second repetition count value. Thus, the second mux 326 outputs the second count value. When the second mode control value is at logic high state, the stepwise linear shaping module 322 generates the stepwise sequence data that corresponds to the ramp wave of FIG. 4C. When the second mode control value is at logic low state, the stepwise linear shaping module 322 generates the stepwise sequence data that corresponds to the triangular wave of FIG. 4B. The comparator 332 receives the second count value from the second mux 326 and the binary zero value from the register 334, compares the second count value with the binary zero value and generates the interrupt status signal at logic low state. The interrupt status register 318 receives the logic low interrupt status signal and stores the interrupt status value as binary zero.

To generate the high-power RF signal at different power levels during real-time, the stepwise linear shaping module 322 generates the stepwise sequence data that corresponds to the ramp wave. When the step size value is a positive value, the ramp wave is a ramp up wave and when the step size value is a negative value, the ramp wave is a ramp down wave. The ramp up wave calibrates the PA 210 such that an amplitude of the high-power RF signal increases. The ramp down wave calibrates the PA 210 such that the amplitude of the high-power RF signal decreases. Thus, the ramp wave shapes the reference baseband stream data and the pre-distorter module 308 selects the corresponding LUT coefficients accordingly. The aforementioned digital pre-distortion process is repeated and continues till the second N-bit counter 330 count value corresponds to binary zero.

When the comparator 332 receives one of the first or second count values as binary zero, the comparator 332 generates the interrupt status signal at logic high state. The interrupt status register 318 receives the logic high interrupt status signal and stores the interrupt status value as binary one. Further, the DSP 212 receives the logic high interrupt status signal and toggles the logic state of the control start trigger signal. Consequently, the event control module 222 toggles the logic state of the start trigger signal. When the start trigger signal toggles between the logic high and low states, the LFSR 320 and the stepwise linear shaping module 322 stop generating the LFSR sequence data and the stepwise sequence data, respectively.

Thus, at the end of the calibration process, the DSP 212 selects the LUT coefficients that ensure linear operation of the PA 210. These LUT coefficients are used to digitally pre-distort the actual digital data. As the pattern generator 304 generates the pattern coefficient data in real-time, the calibration of the PA 210 is performed in real-time during time periods the RF transceiver 202 does not transmit digital data. Further, as the pattern coefficient data is not stored in the system memory 220, the DSP 212 does not have to fetch the pattern coefficient data for calibration, resulting in reduced data traffic on the system bus 214. The reduced data traffic further reduces power consumption of the RF transceiver 202. Moreover, as the DSP 212 does not generate the pattern coefficient data, the machine cycles thereof are reduced.

Figure 5A:
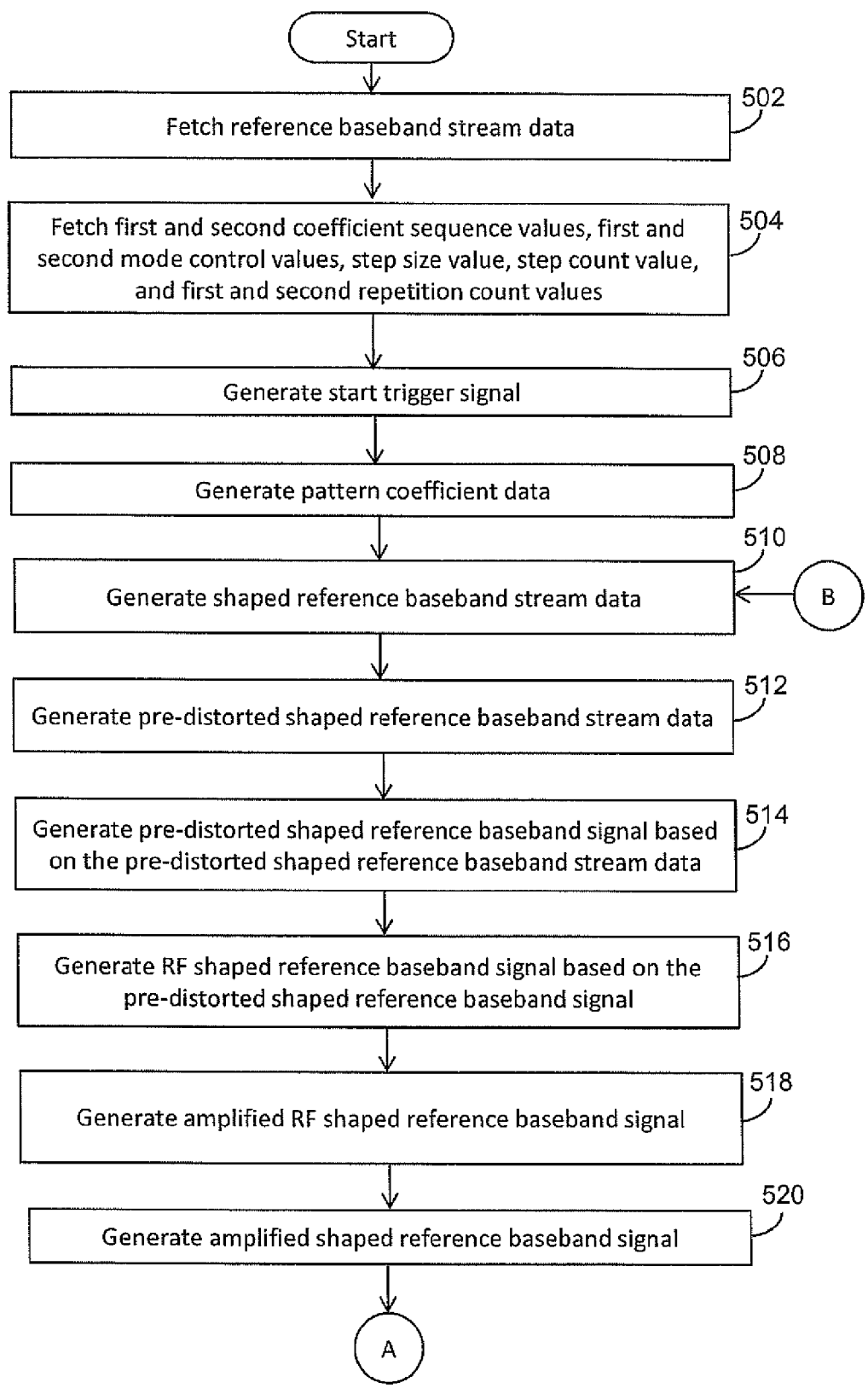
FIGS. 5A and 5B are a flow chart illustrating a method of calibrating a power amplifier of the RF transceiver of FIG. 2 in accordance with an embodiment of the present invention.
Figure 5B:
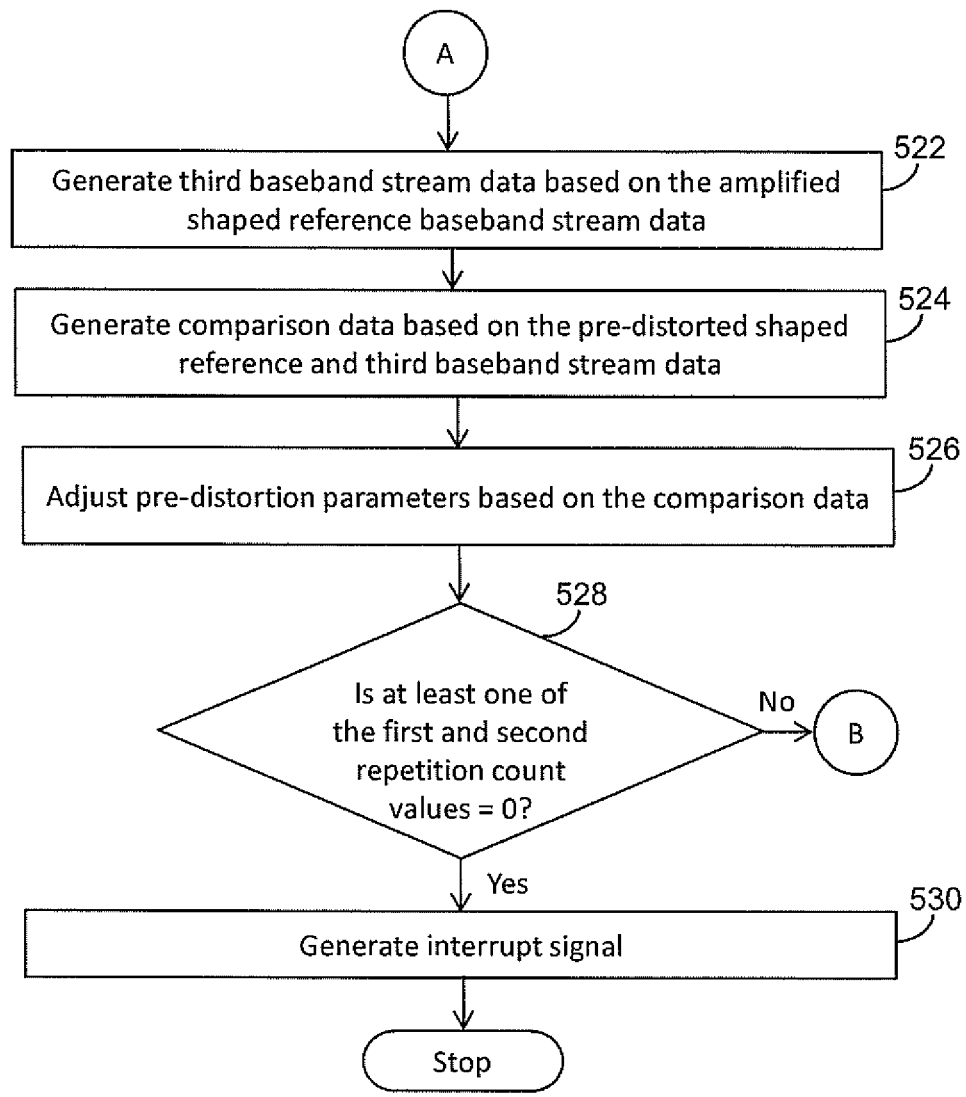

Referring now to FIGS. 5A and 5B, a flow chart illustrating a method of calibrating the PA 210 in accordance with an embodiment of the present invention is shown. At step 502, the multiplier 306 receives the reference baseband stream data. At step 504, the LFSR 320 receives the seed value, the first coefficient sequence value, and the first repetition count value. The stepwise linear shaping module 322 receives the step size value, the step count value, the second coefficient sequence value, the second repetition count value, and the second mode control value. The first mux 324 receives the first mode control value. At step 506, the event control module 222 generates the start trigger signal. At step 508, the pattern generator 304 generates the pattern coefficient data.

At step 510, the multiplier 306 generates the shaped reference baseband stream data. At step 512, the pre-distorter module 308 generates the pre-distorted shaped reference baseband stream data based on the shaped reference baseband stream data. At step 514, the DAC 232 generates a pre-distorted shaped reference baseband signal based on the pre-distorted shaped reference baseband stream data. At step 516, the RF mixer 230 generates the low-power reference RF signal based on the pre-distorted shaped reference baseband signal. At step 518, the PA 210 generates the high-power reference RF signal. At step 520, the RF mixer 230 generates the amplified shaped reference baseband signal. At step 522, the ADC 234 generates the amplified shaped reference baseband stream data based on the amplified shaped reference baseband stream data. At step 524, the DSP 212 generates the comparison data based on the pre-distorted shaped reference and amplified shaped reference baseband stream data. At step 526, the DSP 212 adjusts the LUT coefficients based on the comparison data.

At step 528, a check is performed to determine whether at least one of the first and second count values equals zero. If at step 526, the comparator 332 determines that at least one of the first and second count values is zero, step 530 is performed. If at step 526, the comparator 332 determines that at least one of the first and second count values is not zero, step 510 is performed. The steps 512 to 530 are repeated thereafter. At step 530, the comparator 332 generates the interrupt status signal.

It will be further understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for calibrating a power amplifier, comprising:
a memory for storing reference baseband stream data;
a digital pre-distorter (DPD), connected to the memory, wherein the DPD includes:
 a programming interface module for storing a seed value, first and second coefficient sequence values, first and second mode control values, a step size value, a step count value, first and second repetition count values, and an interrupt status value;
 a pattern generator connected to the programming interface module for receiving the seed value, the first and second coefficient sequence values, the first and second mode control values, the step size value, the step count value, and the first and second repetition count values, and generating pattern coefficient data;
 a multiplier connected to the pattern generator and the memory for receiving the pattern coefficient data and the reference baseband stream data, respectively, and generating shaped reference baseband stream data; and
 a pre-distorter module connected to the multiplier for receiving the shaped reference baseband stream data and generating pre-distorted shaped reference baseband stream data, wherein the memory stores the pre-distorted shaped reference baseband stream data;
a digital-to-analog converter (DAC) connected to the pre-distorter module for receiving the pre-distorted shaped reference baseband stream data and generating a pre-distorted shaped reference baseband signal;
a radio frequency (RF) mixer, connected to the DAC for receiving the pre-distorted shaped reference baseband signal and generating an RF shaped reference baseband signal, wherein the power amplifier is connected to the RF mixer for receiving the RF shaped reference baseband signal and generating an amplified RF shaped reference baseband signal, and wherein the RF mixer receives the amplified RF shaped reference baseband signal and generates an amplified shaped reference baseband signal;
an analog-to-digital converter (ADC) connected to the RF mixer for receiving the amplified shaped reference baseband signal and generating amplified shaped reference baseband stream data; and
a processor connected to the ADC and the memory for receiving the amplified shaped and pre-distorted shaped reference baseband stream data, respectively, generating comparison data based on the amplified shaped and pre-distorted shaped reference baseband stream data, and adjusting a plurality of pre-distortion parameters based on the comparison data, thereby calibrating the power amplifier.

2. The system of claim 1, wherein the pre-distorter module further includes a look-up table (LUT) for storing the plurality of pre-distortion parameters.

3. The system of claim 2, wherein the processor is further connected to the pre-distorter module for adjusting the plurality of pre-distortion parameters.

4. The system of claim 3, wherein the RF mixer further receives an RF signal and generates an analog baseband signal, and wherein the ADC receives the analog baseband signal and generates baseband stream data.

5. The system of claim 4, wherein the processor further receives the baseband stream data, checks a presence of user-data in the baseband stream data, and adjusts the plurality of pre-distortion parameters when the first baseband stream data does not include user-data.

6. The system of claim 1, wherein the programming interface module further generates an interrupt status signal when the plurality of pre-distortion parameters are adjusted.

7. The system of claim 1, wherein the programming interface module includes:
a seed control register for storing the seed value;
a first calibration register for storing the first coefficient sequence value and the first repetition count value;
a calibration mode control register for storing the first and second mode control values;
a second calibration register for storing the step size value, the step count value, the second coefficient sequence value and the second repetition count value; and
an interrupt status register for storing the interrupt status value.

8. The system of claim 7, wherein the pattern generator includes:
a linear feedback shift register (LFSR), connected to the seed control register and the first calibration register for receiving the seed value, the first coefficient sequence value, and the first repetition count value and generating LFSR sequence data;
a step-wise linear shaping module, connected to the second calibration register and the calibration mode control register for receiving the step size value, the step count value, the second coefficient sequence value, the second repetition count value, and the second mode control value, and generating stepwise sequence data; and
a multiplexer having a first input terminal connected to the LFSR for receiving the LFSR sequence data, a second input terminal connected to the step-wise linear shaping module for receiving the stepwise sequence data, a select input terminal connected to the calibration mode control register for receiving the first mode control value, and an output terminal for outputting at least one of the LFSR sequence and stepwise sequence data as the pattern coefficient data.

9. The system of claim 8, wherein the multiplexer outputs the stepwise sequence data for at least one of increasing and decreasing an amplitude of the shaped reference baseband signal by way of the second mode control value.

10. The system of claim 1, further comprising an event control module connected to the DPD for generating and providing a start trigger signal to the DPD, and wherein the DPD generates the pattern coefficient data based on the start trigger signal.

11. A radio-frequency (RF) transceiver, comprising:
a baseband processing unit, including:
   a memory for storing first baseband stream data;
   a processor for generating a control start trigger signal;
   an event control module connected to the processor for receiving the control start trigger signal and generating a start trigger signal; and
   a digital pre-distorter (DPD) connected to the memory and the event control module for receiving the first baseband stream data and the start trigger signal, respectively, and generating pre-distorted second baseband stream data, wherein the memory stores the pre-distorted second baseband stream data;
a radio-frequency integrated circuit (RFIC) connected to the baseband processing unit, wherein the RFIC includes:
   a data converter connected to the DPD for receiving the pre-distorted second baseband stream data and generating a pre-distorted shaped reference baseband signal; and
   an RF mixer connected to the data converter for receiving the pre-distorted shaped reference baseband signal and generating an RF shaped reference baseband signal;
a power amplifier connected to the RF mixer for receiving the RF shaped reference baseband signal and generating an amplified RF shaped reference baseband signal, wherein the RF mixer receives the amplified RF shaped reference baseband signal and generates an amplified shaped reference signal, and wherein the data converter receives the amplified shaped reference signal and generates third baseband stream data, wherein the processor receives the pre-distorted second and third baseband stream data, generates comparison data, and adjusts a plurality of pre-distortion parameters based on the comparison data, thereby calibrating the power amplifier, wherein the RF mixer further receives an RF signal and generates an analog baseband signal, and the data converter further receives the analog baseband signal and generates baseband stream data, and wherein the DPD includes: a programming interface module for storing a seed value, first and second coefficient sequence values, first and second mode control values, a step size value, a step count value, first and second repetition count values, and an interrupt status values; and a pattern generator connected to the programming interface module for receiving the seed value, the first and second coefficient sequence values, the first and second mode control values, the step size value, the step count value, the first and second repetition count values, and generating pattern coefficient data.

12. The RF transceiver of claim 11, wherein the DPD includes:
   a multiplier connected to the pattern generator and the memory for receiving the pattern coefficient data and the first baseband stream data, respectively, and generating the second baseband stream data; and
   a pre-distorter module connected to the multiplier for receiving the second baseband stream data and generating the pre-distorted second baseband stream data.

13. The RF transceiver of claim 12, wherein the programming interface module includes:
   a seed control register for storing the seed value;
   a first calibration register for storing the first coefficient sequence value and the first repetition count value;
   a calibration mode control register for storing the first and second mode control values;
   a second calibration register for storing the step size value, the step count value, the second coefficient sequence value and the second repetition count value; and
   an interrupt status register for storing the interrupt status value.

14. The RF transceiver of claim 13, wherein the pattern generator includes:
   a linear feedback shift register (LFSR) connected to the seed control register and the first calibration register for receiving the seed value, the first coefficient sequence value, and the first repetition count value and generating LFSR sequence data;
   a stepwise linear shaping module connected to the second calibration register and the calibration mode control register for receiving the step size value, the step count value, the second coefficient sequence value, the second repetition count value, and the second mode control value, and generating stepwise sequence data; and
   a multiplexer having a first input terminal connected to the LFSR for receiving the LFSR sequence data, a second input terminal connected to the stepwise linear shaping module for receiving the stepwise sequence data, a select input terminal connected to the calibration mode control register for receiving the first mode control value, and an output terminal for outputting at least one of the LFSR sequence and stepwise sequence data as the pattern coefficient data.

15. The RF transceiver of claim 14, wherein the multiplexer outputs the stepwise sequence data for at least one of increasing and decreasing an amplitude of the shaped reference baseband signal by way of the second mode control value.

16. The RF transceiver of claim 14, wherein the pre-distorter module further includes a look-up table (LUT), and wherein the LUT stores the plurality of pre-distortion parameters.

17. The RF transceiver of claim 16, wherein the processor is further connected to the pre-distorter module for adjusting the plurality of pre-distortion parameters.

18. The RF transceiver of claim 11, wherein the processor further receives the baseband stream data, checks a presence of user-data in the baseband stream data, and adjusts the plurality of pre-distortion parameters when the baseband stream data does not include user-data.

19. A method for calibrating a power amplifier, comprising:
   storing first baseband stream data;
   storing a seed value, first and second coefficient sequence values, first and second mode control values, a step size value, a step count value, first and second repetition count values, and an interrupt status value;
   generating pattern coefficient data based on the seed value, the first and second coefficient sequence values, the first and second mode control values, the step size value, the step count value, and the first and second repetition count values;
   generating second baseband stream data;
   generating pre-distorted second baseband stream data based on the second baseband stream data;

generating a pre-distorted shaped reference baseband signal based on the pre-distorted second baseband stream data and the pattern coefficient data;
generating an RF shaped reference baseband signal based on the pre-distorted shaped reference baseband signal;
generating an amplified RF shaped reference baseband signal based on the RF shaped reference baseband signal;
generating an amplified shaped reference baseband signal based on the amplified RF shaped reference baseband signal;
generating third baseband stream data based on the amplified shaped reference baseband signal;
generating comparison data based on the pre-distorted second and third baseband stream data; and
adjusting a plurality of pre-distortion parameters based on the comparison data, thereby calibrating the power amplifier.

* * * * *